United States Patent
Hashimoto

(10) Patent No.: US 9,747,972 B2
(45) Date of Patent: Aug. 29, 2017

(54) MEMORY CONTROLLER, INFORMATION PROCESSING DEVICE, AND REFERENCE VOLTAGE ADJUSTMENT METHOD

(71) Applicant: FUJITSU LIMITED, Kawasaki-shi, Kanagawa (JP)

(72) Inventor: Michitaka Hashimoto, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 300 days.

(21) Appl. No.: 14/599,585

(22) Filed: Jan. 19, 2015

(65) Prior Publication Data

US 2015/0213878 A1    Jul. 30, 2015

(30) Foreign Application Priority Data

Jan. 24, 2014 (JP) ................... 2014-011872

(51) Int. Cl.
*G06F 12/00* (2006.01)
*G11C 11/4099* (2006.01)
*G06F 13/16* (2006.01)

(52) U.S. Cl.
CPC ...... *G11C 11/4099* (2013.01); *G06F 13/1689* (2013.01)

(58) Field of Classification Search
CPC .............. G11C 7/1078; G11C 7/1087; G11C 2207/107; G11C 11/4093; G11C 7/1066; G11C 7/1072; G11C 7/109; G11C 11/4099; G06F 13/1689
See application file for complete search history.

(56) References Cited

U.S. PATENT DOCUMENTS

| | | | |
|---|---|---|---|
| 7,020,031 B2* | 3/2006 | Shin ..................... | G11C 7/1066 365/100 |
| 2003/0086303 A1* | 5/2003 | Jeong ................... | G11C 7/1078 365/189.05 |
| 2010/0309733 A1 | 12/2010 | Abe et al. | |
| 2012/0242385 A1* | 9/2012 | Tokuhiro ............ | G06F 13/1689 327/158 |

FOREIGN PATENT DOCUMENTS

| | | |
|---|---|---|
| JP | 07-312538 | 11/1995 |
| JP | 10-145222 | 5/1998 |
| JP | 2010-282684 | 12/2010 |
| WO | 2011/077573 | 6/2011 |

* cited by examiner

*Primary Examiner* — Zhuo Li
(74) *Attorney, Agent, or Firm* — Fujitsu Patent Center

(57) ABSTRACT

A memory controller has a first input buffer that determines a data signal that is to be received, on the basis of a reference voltage, a second inputs buffer that inputs a data strobe signal that is to be received, a data latch circuit that fetches an internal data signal, which is outputted by the first input buffer, on the basis of a phase of a rising edge and a falling edge of an internal data strobe signal, which is outputted by the second input buffer, a duty ratio detection circuit that detects a duty ratio of the internal data strobe signal, and a reference voltage generating circuit that adjusts the reference voltage on the basis of the duty ratio detected by the duty ratio detection circuit.

6 Claims, 14 Drawing Sheets

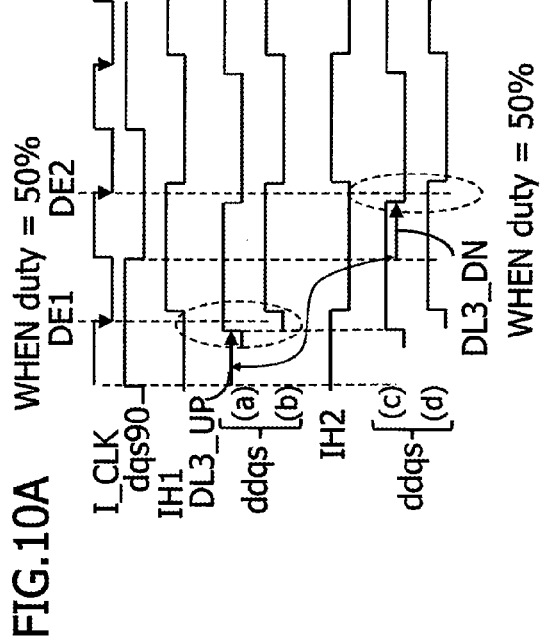
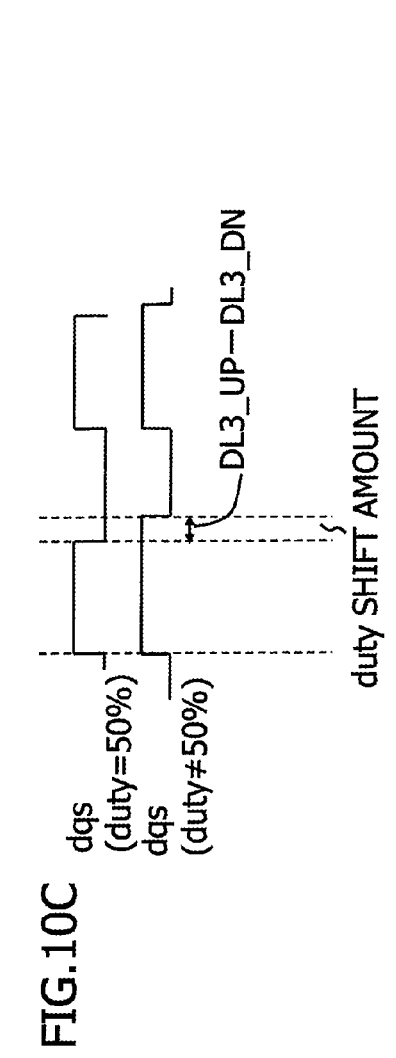
FIG.10A FIG.10B FIG.10C

COMPARISON OF TWO EDGES OF DQS (duty = 56%)

duty DETERMINED BY DIFFERENCE BETWEEN
VARIABLE DELAY SETTING VALUES CD1 AND CD2

| VARIABLE DELAY SETTING VALUE CD1 − VARIABLE DELAY SETTING VALUE CD2 (=X) | Duty[%] |
|---|---|
| X>0 | H WIDTH IS LARGE (50 + aX) |
| X=0 | H WIDTH = L WIDTH (50) |
| X<0 | L WIDTH IS LARGE (50 + aX) |

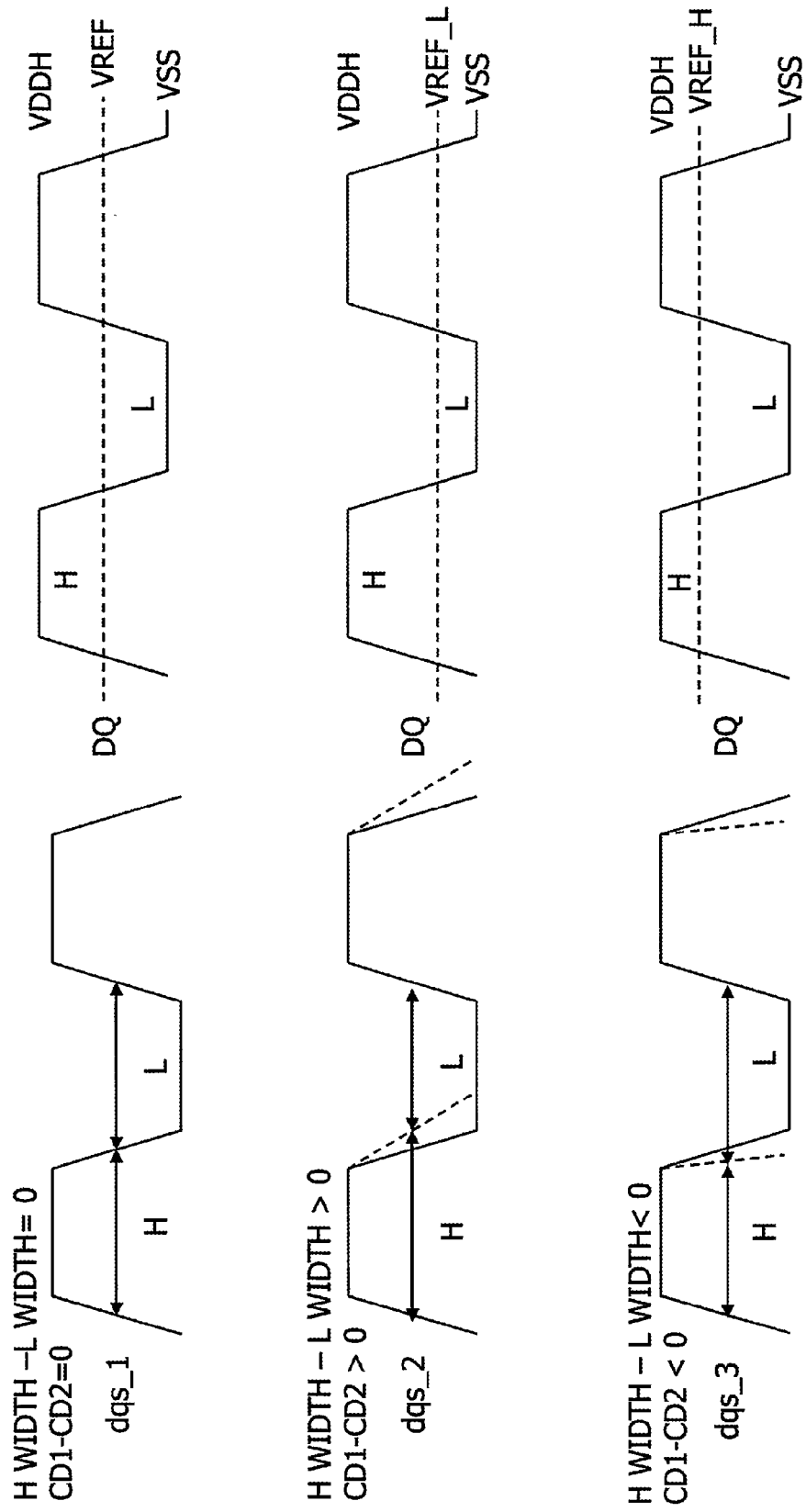

MEMORY CONTROLLER, INFORMATION PROCESSING DEVICE, AND REFERENCE VOLTAGE ADJUSTMENT METHOD

CROSS-REFERENCE TO RELATED APPLICATION

This application is based upon and claims the benefit of priority of the prior Japanese Patent Application No. 2014-011872, filed on Jan. 24, 2014, the entire contents of which are incorporated herein by reference.

FIELD

The present invention relates to a memory controller, an information processing device, and a reference voltage adjustment method.

BACKGROUND

A memory controller is incorporated in an arithmetic processing device (CPU chip) and controls memory access to a main memory in response to a memory access request from an arithmetic processor core (CPU core). Alternatively, the memory controller is provided between the arithmetic processing device (CPU chip) and main memory and controls memory access from the arithmetic processing device.

A double data rate (DDR) synchronous dynamic random access memory (SDRAM) has been widely used as the main memory. The DDR SDRAM receives a clock from a memory controller and returns a data strobe signal (referred to hereinbelow as "DQS signal") generated on the basis of the clock and a data signal (referred to hereinbelow as "DQ signal") synchronized with the rising edge and falling edge of the DQS signal to the memory controller. The memory controller also detects the H level or L level of the DQ signal by using the timing of the rising edge and falling edge of the DQS signal.

According to the DDR standard, the DQS signal is a differential signal with a duty ratio of 50% and the DQ signal is a single-phase signal, and the SDRAM transmits those signals to the memory controller. In response, the memory controller detects the phases of the rising edge and falling edge of the received DQS signal, generates the internal DQS signal, and latches the DQ signal on the basis of the timing of the internal DQS signal. The memory controller also has an input buffer that compares the received DQ signal with a reference voltage and generates an H-level or L-level internal DQ signal.

The memory controller is disclosed in WO 2011/077573, JP07-312538, JP10-145222 and JP2010-282684.

SUMMARY

In response to recent demands for energy saving, the DQ signal voltage has been reduced to 1.35 V in the DDR3L standard and to 1.05 V in the DDR4L standard. The reference voltage which is used in the input buffer of the DQ signal has decreases accordingly, and the margin for H level determination and L level determination has also decreased. As a result, where the reference voltage changes to a value other than 50% of the amplitude voltage of the inputted DQ signal due to external factors during system operation, for example, changes in power supply voltage and changes in temperature, the margin for H level or L level determination decreases and the H level or L level is not adequately determined.

An aspect of an embodiment is a memory controller comprising:
a first input buffer that determines a data signal that is to be received, on the basis of a reference voltage;
a second inputs buffer that inputs a data strobe signal that is to be received;
a data latch circuit that fetches an internal data signal, which is outputted by the first input buffer, on the basis of a phase of a rising edge and a falling edge of an internal data strobe signal, which is outputted by the second input buffer;
a duty ratio detection circuit that detects a duty ratio of the internal data strobe signal; and
a reference voltage generating circuit that adjusts the reference voltage on the basis of the duty ratio detected by the duty ratio detection circuit.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 10A, 10B and 10C illustrate the operation of the duty ratio detection circuit 42.

FIG. 14 illustrates the reference voltage control process of the present embodiment.

DESCRIPTION OF EMBODIMENTS

Figure 1:
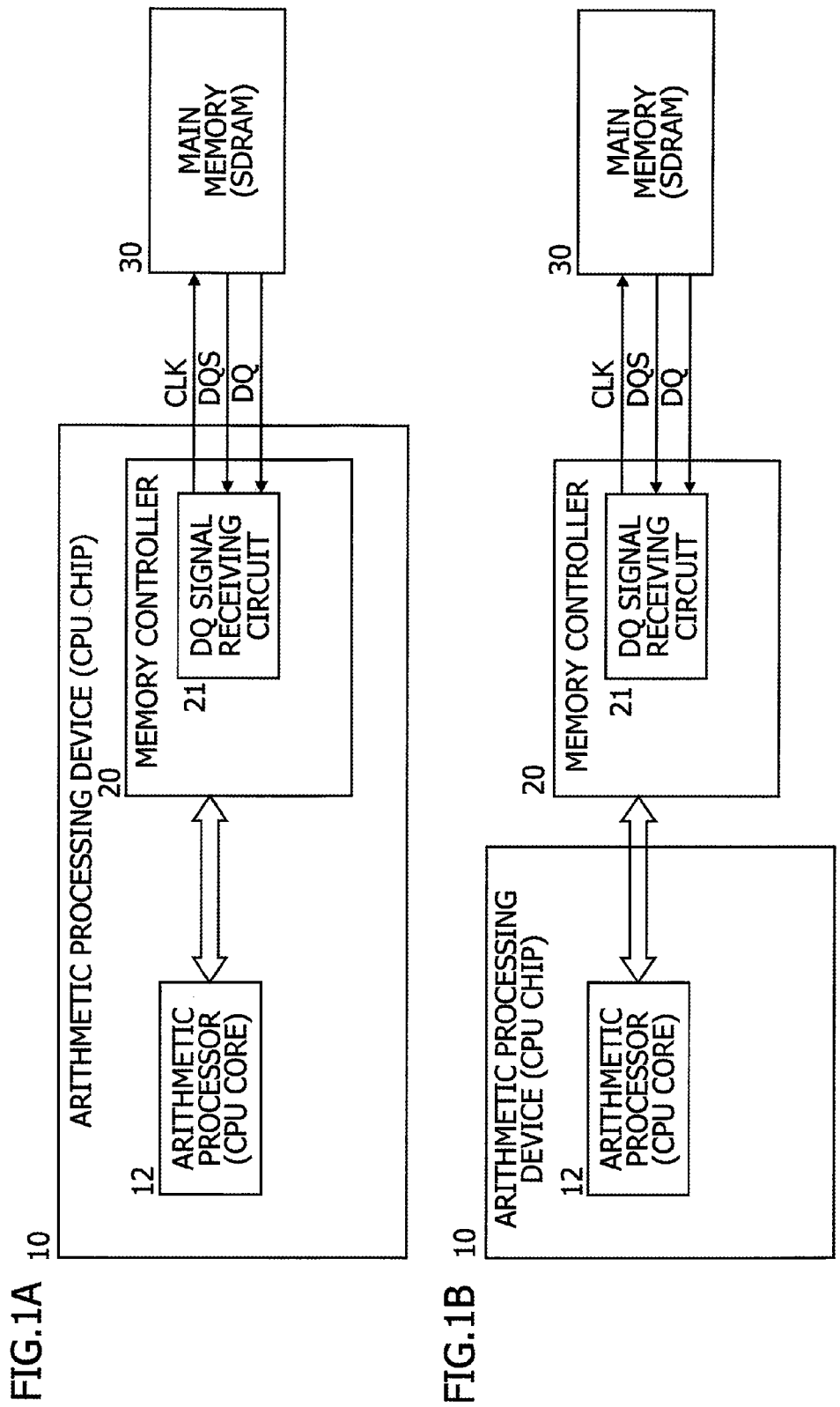
FIGS. 1A and 1B depict a configuration example of an information processing device having a memory controller according to the present embodiment, an arithmetic processing device (CPU chip), and a main memory.

FIGS. 1A and 1B depict a configuration example of an information processing device having a memory controller according to the present embodiment, an arithmetic processing device (CPU chip), and a main memory. FIG. 1A depicts an information processing device (computer system) having an arithmetic processing device (CPU chip) 10 having an arithmetic processor core (CPU core) 12 and a memory controller 20, and a main memory 30. The arithmetic processor core (CPU core) 12 issues a memory access request to the memory controller 20, and the memory controller 20 transmits a command, an address, and a clock CLK (not illustrated in the figure) to the main memory 30 in response to the memory access request. Meanwhile, in the case of a read request, the main memory 30 returns to the memory controller 20 a data strobe signal DQS (referred to hereinbelow as "DQS signal") generated on the basis of the supplied clock CLK and a data signal DQ (referred to hereinbelow as "DQ signal") synchronized with a rising edge and falling edge of the DQS signal. The memory controller 20 has a DQ signal receiving circuit 21, and the DQ signal receiving circuit 21 fetches (latches) the DQ signal on the basis of the phase of the received DQS signal. The memory controller 20 then transmits the latched DQ signal to the arithmetic processor (CPU core) 12.

FIG. 1B depicts an information processing device having the arithmetic processing device (CPU chip) 10 incorporating the arithmetic processor core (CPU core) 12, the memory controller 20 configured by a chip different from the arithmetic processing device 10, and the main memory 30. The operation relating to the memory access of the arithmetic processor core (CPU core) 12, the memory controller 20, and the main memory 30 is the same as illustrated by FIG. 1A.

In a DDR SDRAM regulated by the DDR3 and later standards, the memory controller 20 transmits a clock CLK to a plurality of memory chips in the main memory 30 via serial transfer. As a result, the phases of the DQS signals returned from the memory chips are spread and do not match.

Accordingly, the DQ signal receiving circuit 21 located in the memory controller 20 fetches (latches) the DQ signal on the basis of the phase of the DQS signal, tunes the phase of the fetched DQ signal on the basis of the difference between the phase of the DQS signal and the phase of the internal clock in the memory controller, and fetches (latches) all of the DQ signals on the basis of the phase of the internal clock. In other words, the DQ signal receiving circuit 21 performs the switching processing of the DQ signal from the phase timing of the DQS signal from the main memory 30 to the phase timing of internal the clock on the memory controller 20 or arithmetic processor 12 side.

[Brief Description of DQ Signal Receiving Circuit]

Figure 2:
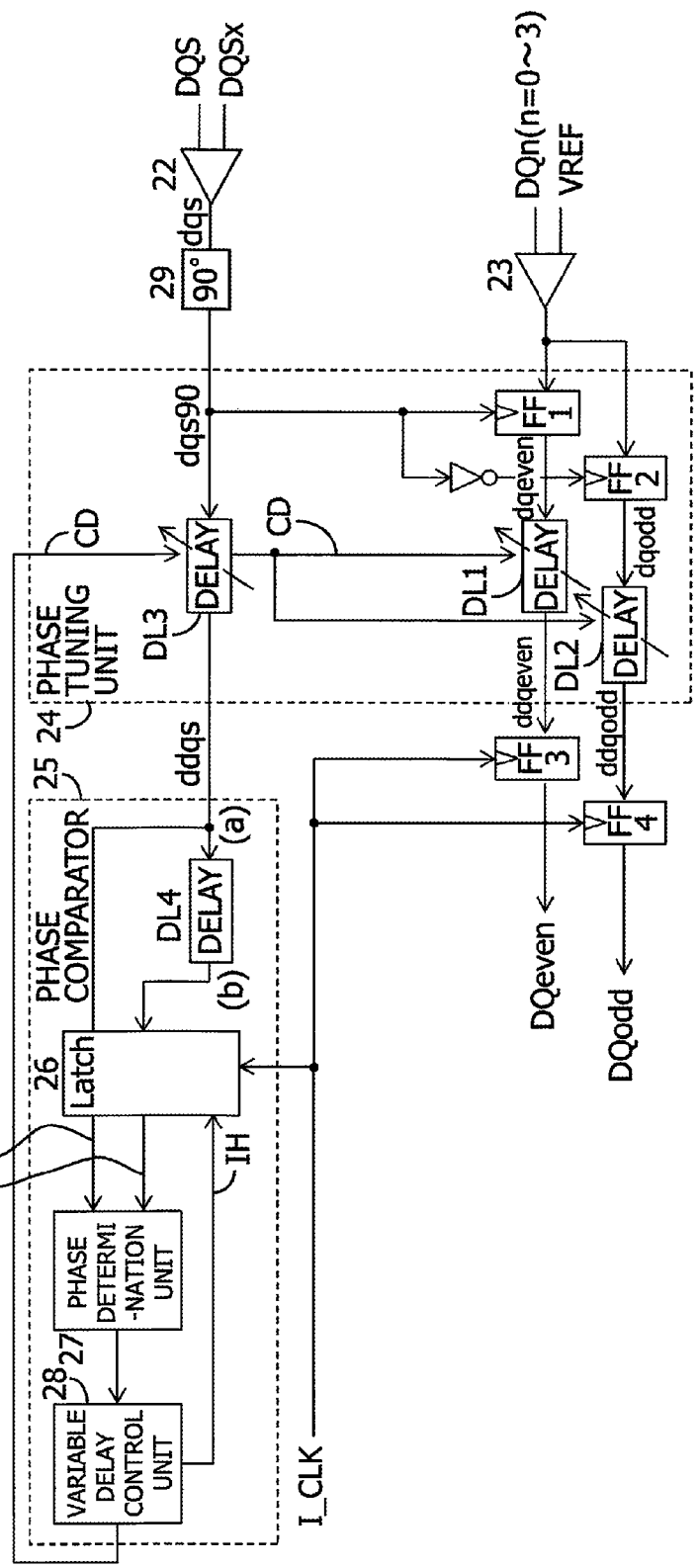
FIG. 2 illustrates an example of the configuration of the DQ signal receiving circuit.

FIG. 2 illustrates an example of the configuration of the DQ signal receiving circuit. The DQ signal receiving circuit 21 has a DQS input buffer 22 that inputs differential data strobe signals DQS, DQSx transmitted from the main memory 30, and a DQ input buffer 23 that inputs a signal-phase data signal DQ transmitted from the main memory. Those input buffers 22, 23 are described hereinbelow in greater detail.

The main memory 30 transmits the DQS signal and the DQ signal, which is synchronized with the rising edges and falling edges of the DQS signal, as a pair, to the memory controller 20. This DQS signal is asynchronous in phase with the internal clock I_CLK in the memory controller 20, and the propagation time of the DQS signal from the main memory 30 to the memory controller 20 is not predicted.

Therefore, firstly, since the phases of the received DQS signal and DQ signal are synchronized, the DQ signal receiving circuit 21 in the memory controller 20 latches the H level or L level of the DQ signal on the basis of the phase of the rising edge and falling edge of the received DQS signal. Secondly, since the phase of the DQS signal and the phase of the internal clock I_CLK are asynchronous, the DQ signal receiving circuit 21 tunes the phase of the DQ signal so as to switch the phase of EQ signal from the phase of the DQS signal to the phase of the internal clock I_CLK.

The DQ signal receiving circuit 21 depicted in FIG. 2 has a phase tuning unit 24 that latches the abovementioned DQ signal on the basis of the timing of both edges of the DQS signal and performs the phase tuning of switching to the timing of the internal clock I_CLK. The phase tuning unit 24 has flip-flops FF1 and FF2 that latch the inputted DQ signal at the timing of both edges of a signal dqs90 which is obtained when a 90° phase shift circuit 29 performs a 90° phase shift of an internal DQS signal dqs outputted by the input buffer 22. The phase tuning unit 24 also has a third variable delay circuit DL3 that delays the 90° phase-shifted DQS signal dqs90 and generates a delay DQS signal ddqs, and first and second variable delay circuits DL1 and DL2 that delay DQ signals dqeven, dqodd latched by the flip-flops FF1 and FF2 and generate delay DQ signals ddqeven, ddqodd. Those variable delay circuits DL1, DL2, and DL3 advance or delay the phase of input signal on the basis of a variable delay setting value CD generated by the below-described phase comparator 25.

The DQ signal receiving circuit 21 also has the phase comparator 25 that compares the phase of the DQS signal with the phase of the internal clock I_CLK and generates the variable delay setting value CD for phase tuning in the phase tuning unit 24. The variable delay setting value CD indicates the delay amount such that eliminates the phase difference correspondingly to the phase difference between the DQS signal and the internal clock I_CLK. The variable delay setting value CD is supplied to the first, second, and third variable delay circuits DL1, DL2, and DL3. As a result, the DQS signal dqs90 and the DQ signals dqeven, dqodd are delayed by the delay time corresponding to the variable delay setting value CD.

The phase comparator 25 has a delay circuit DL4 that delays the delay DQS signal ddqs by a very small fixed width and a latch circuit 26 that is in the latch enable state during the determination timing of the rising edge timing signal IH of the ddqs signal and latches the input ddqs(a) and output ddqs(b) of the delay circuit DL4 synchronously with the falling edges of the internal clock I_CLK. In other words, the rising edge timing signal IH is the inhibit signal of the latch circuit 26, and the latch circuit 26 is in the operation state while IH=L.

The phase comparator 25 also has a phase determination unit 27 that determines the phase difference between the rising edge of the delay DQS signal ddqs and the falling edge of the internal clock I_CLK on the basis of phase information 1, 2 latched by the latch circuit 26. The phase comparator 25 also has a variable delay control unit 28 that generates the variable delay setting value CD that controls the delay amount of the variable delay circuit DL3 such as to eliminate the phase difference, on the basis of the phase determination result of the phase determination unit 27, and also generates an optimum edge timing signal IH on the basis of the detected phase difference.

The delay DQ signals ddqeven and ddqodd that have been phase-tuned by the variable delay circuits DL1 and DL2 are eventually latched by flip-flops FF3 and FF4 on the basis of the timing of the internal clock I_CLK, thereby making it possible to switch the DQ signal to the timing for the internal clock I_CLK.

Figure 3:
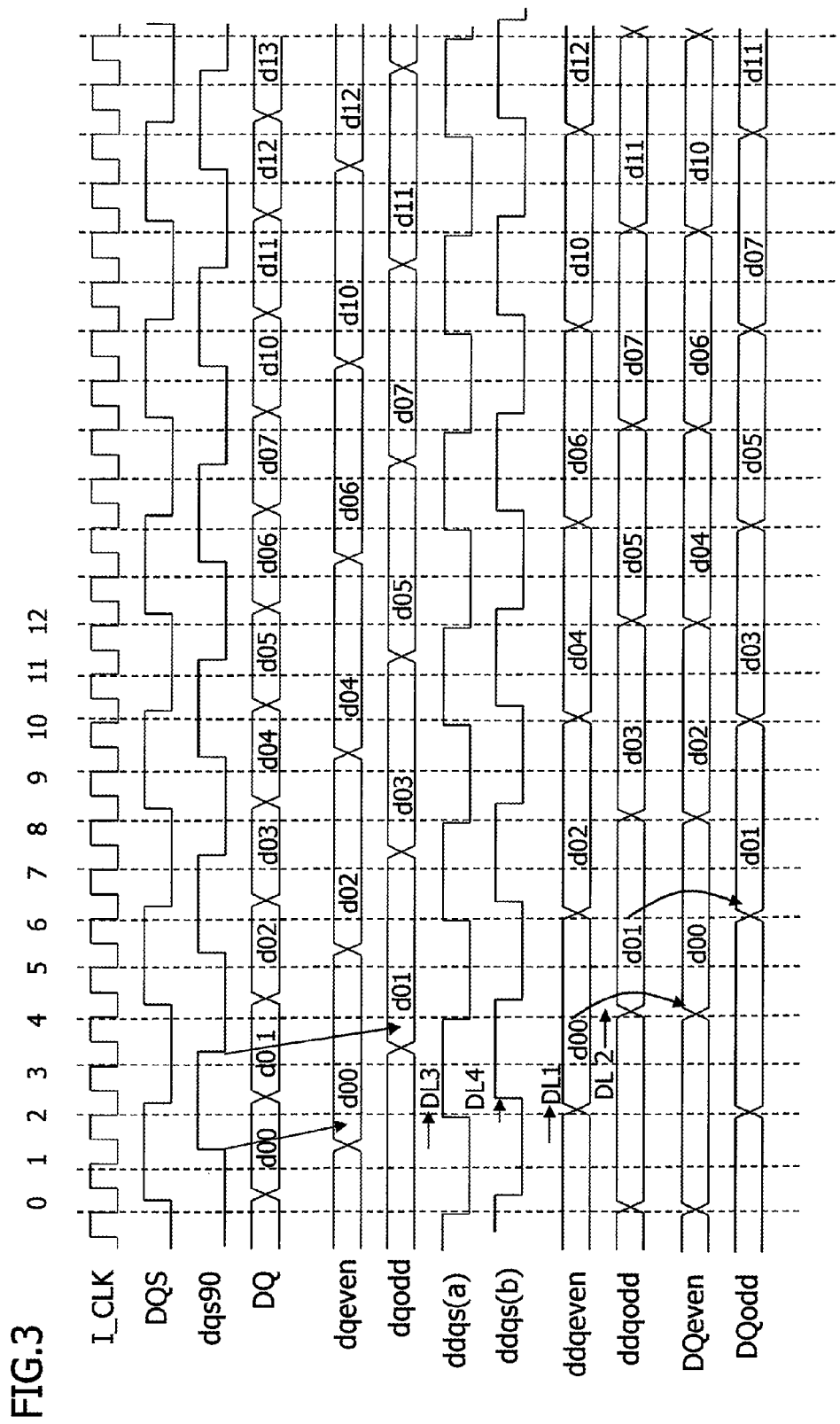
FIG. 3 is a timing chart illustrating the operation of the DQ signal receiving circuit.

FIG. 3 is a timing chart illustrating the operation of the DQ signal receiving circuit. In the example depicted in FIG. 3, it is assumed that the internal clock I_CLK has a frequency which is four times the frequency of the DQS signal transmitted by the main memory 30. Further, as described hereinabove, the phase of the DQS signal and the phase of the internal clock I_CLK are asynchronous.

The 90° phase shift circuit 29 generates the 90° phase shift signal dqs90 by shifting the phase of the DQS signal dqs inputted by the DQS input buffer 22 by 90°. At the rising edge and falling edge timings of the 90° phase shift signal dqs90, the flip-flops FF1 and FF2 latch the DQ signal inputted by the DQ input buffer 23 and output the DQ signals dqeven and dqodd. As a result, the high-speed DQ signal is converted into a low-speed DQ signal divided in two by frequency.

Figure 4:
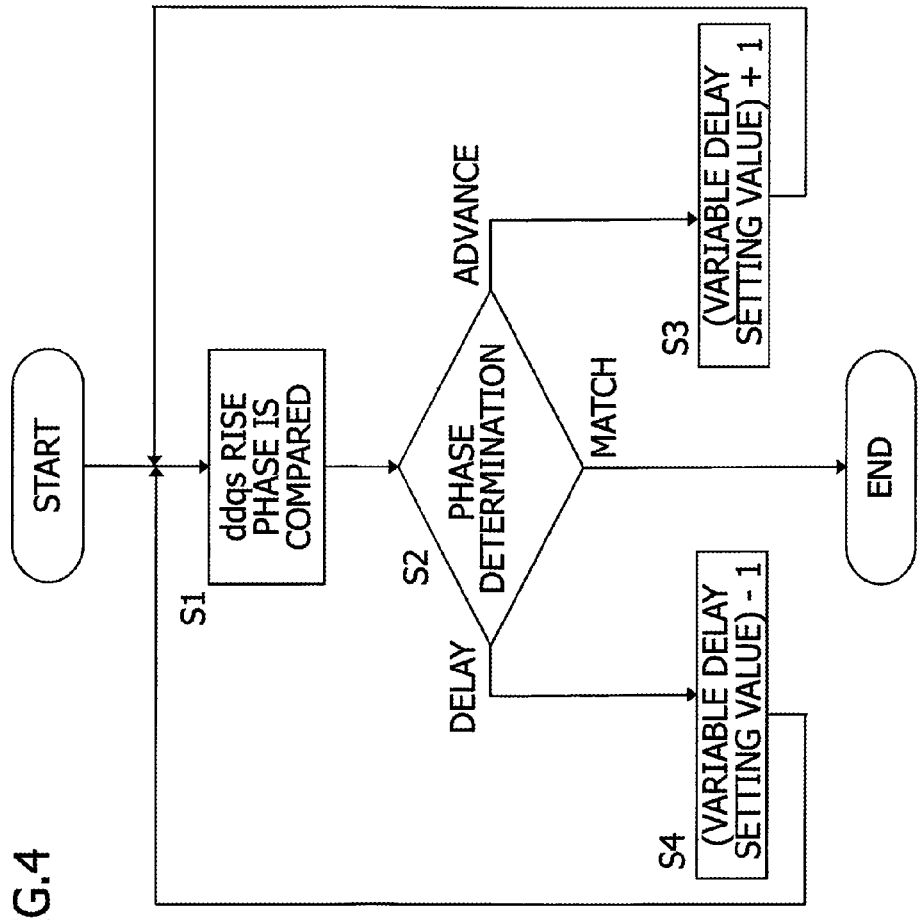
FIG. 4 is a flowchart illustrating the operation performed by the phase comparator 25 and the phase tuning unit 24.
Figure 5:
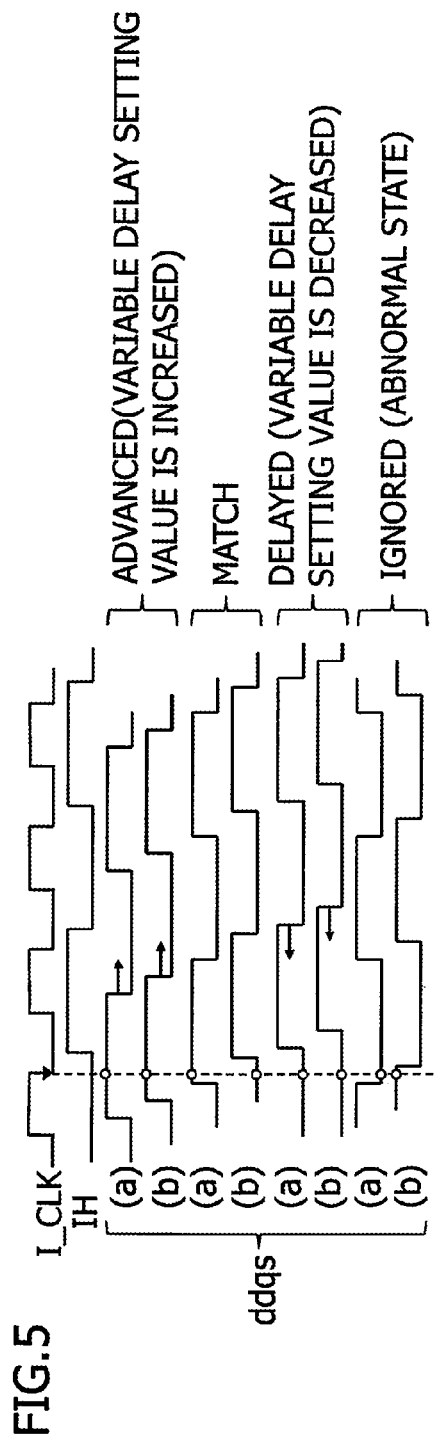
FIG. 5 illustrates the operation of the phase determination unit 27 in the phase comparator 25.

The operation of the phase comparator 25 is described hereinafter. FIG. 4 is a flowchart illustrating the operation performed by the phase comparator 25 and the phase tuning unit 24. FIG. 5 illustrates the operation of the phase determination unit 27 in the phase comparator 25.

As depicted in the flowchart in FIG. 4, the phase determination unit 27 of the phase comparator 25 performs phase comparison of the rising edge of the delay DQS signal ddqs and the falling edge of the internal clock I_CLK. Where the phase determination result is "ADVANCE" ("ADVANCE" in S2), the variable delay control unit 28 adds 1 to the variable delay setting value CD of the variable delay circuit DL3 and increases the delay amount of the variable delay circuit DL3 (S3). Where the phase determination result is "DELAY" ("DELAY" in S2), the variable delay control unit 28 subtracts 1 from the variable delay setting value CD of the variable delay circuit DL3 and decreases the delay amount of the variable delay circuit DL3 (S4).

Then, the above-described phase comparison S1, phase determination S2, and tuning S3 and S4 of the variable delay setting value are repeated until the phases match in the phase determination S2. Where it is detected in the phase determination S2 that the phases have matched, the phase tuning operation by the phase comparator 25 and the phase tuning unit 24 is ended. The variable delay setting value CD is also supplied to the first and second variable delay circuits DL1, DL2, and the phase of the delay DQ signals ddqeven and ddqodd, which are the output thereof, matches the phase of the falling edge of the internal clock I_CLK.

Returning to FIGS. 2 and 3, the variable delay circuit DL3 delays the 90° phase shift DQS signal dqs90 by the variable delay setting value CD, and outputs the delay DQS signal ddqs(a). The variable delay circuit DL4 then further delays the delay DQS signal ddqs(a) by a fixed delay and outputs yet another delay DQS signal ddqs(b).

As indicated in FIG. 5 which is an explanatory drawing illustrating the operation of the phase determination unit 27 of the phase comparator 25, the latch circuit 26 latches the two delay DQS signals ddqs(a) and ddqs(b) synchronously with the falling edge of the internal clock I_CLK within the period of the L level of the rising edge timing signal IH. Then, the phase determination unit 27 detects whether the phase of the delay DQS signals ddqs(a) and ddqs(b) is advanced or delayed with respect to the rising edge of the internal clock I_CLK on the basis of the phase information 2, 1 latched by the latch circuit 26.

As indicated in the phase comparison truth-value table in FIG. 5, when the phase information 2 and 1 latched by the latch circuit 26 is "11", the phase of the delay DQS signals ddqs(a) and ddqs(b) is advanced with respect to that of the rising edge of the internal clock I_CLK. Where the information is "01", the phases match, and where the information is "00", the former phase is delayed with respect to the latter. Where the information is "10", an abnormal state is assumed and this case is ignored.

For the sake of simplicity, the internal clock I_CLK in FIG. 5 is depicted to have a period which is 1/2 (two-fold frequency) that of the DQS signal. Therefore, the rising edge timing signal IH has the same period as the DQS signal, and the duty ratio is 50%. When the internal clock I_CLK has a period which is 1/4 (four-fold frequency) that of the DQS signal, the rising edge timing signal IH has the same period as the DQS signal, the duty ratio is 75%, the L level is only in a 1/4 period, and the latch operation of the latch circuit 26 is performed synchronously with one of four falling edges of the internal clock I_CLK.

FIG. 3 is a timing chart relating to the state in which the abovementioned phase comparison and phase tuning are completed. As depicted in FIG. 3, the delay DQS signals ddqs(a) and ddqs(b) are delayed with respect to the 90° phase shift signal dqs90 by DL3 and DL3+DL4, respectively, the former being the delay amount of the variable delay circuit DL3 and the latter being obtained by adding the delay amount of the fixed delay circuit DL4 to the DL3. Likewise, the delay DS signals ddqeven and ddqodd are delayed by the delay amounts of the variable delay circuits DL1 and DL2, respectively, from the DQ signals dqeven and dqodd latched by the flip-flops FF1 and FF2. As a result, the delay DQ signals ddqeven and ddqodd are synchronized in phase with the falling edges of the internal clock I_CLK.

The flip-flops FF3 and FF4 then latch the delay DQ signals ddqeven and ddqodd synchronously with the falling edges of the internal clock I_CLK. The flip-flops FF3 and FF4 are enabled within the timing period of the latch timing signal and latch the delay DQ signals ddqeven and ddqodd synchronously with one of four falling edges of the internal clock I_CLK.

[Changes in Duty Ratio of DQS Signal]

Figure 6:
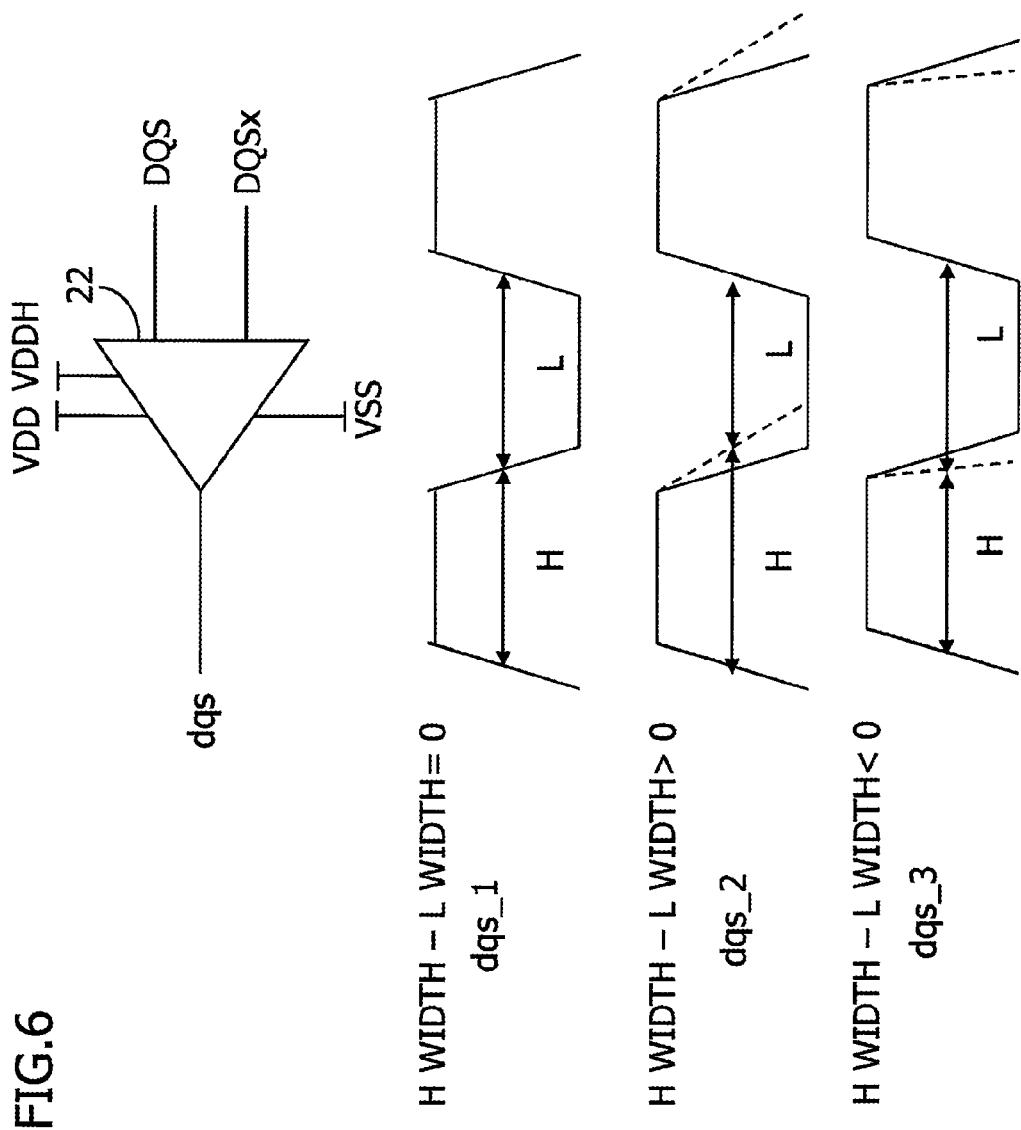
FIG. 6 illustrates changes in the duty ratio of the DQS signal.

FIG. 6 illustrates changes in the duty ratio of the DQS signal. The DQS input buffer 22 receives the differential DQS signals DQS and DQSx transmitted from the main memory 30 and outputs a single-phase internal DQS signal dqs. Further, the DQS input buffer 22 converts the level of the amplitude voltages of the differential DQS signals DQS and DQSx from that of the I/O power supply VDDH to the internal power supply VDD.

The main memory 30 performs the transmission by setting the duty ratio of the DQS signals DQS and DQSx to 50%. However, the rising time and falling time of the internal DQS signal dqs outputted by the DQS input buffer 22 change due to temperature variations or changes in power supply voltages VDDH/VDD. Furthermore, since the change width of the rising time and falling time is not necessarily the same, the duty ratio of the internal DQS signal dqs changes.

As an example of changes in characteristics, FIG. 6 shows an internal DQS signal dqs_1 in which the H level width is the same as the L level width and the duty ratio is 50%, an internal DQS signal dqs_2 in which the falling time is extended, the H level width is larger than the L level width, and the duty ratio exceeds 50%, and an internal DQS signal dqs_3 in which, conversely, the falling time is shortened, the H level width is less than the L level width, and the duty ratio is less than 50%.

Such a relationship example is verified experimentally, and the relationship between the changes in the duty ratio and temperature variations or changes in power supply voltages VDDH/VDD is determined experimentally. In any case, changes in characteristics caused by temperature variations or changes in power supply voltages VDDH/VDD have been found to have some causal relationship with changes in the duty ratio.

Figure 7:
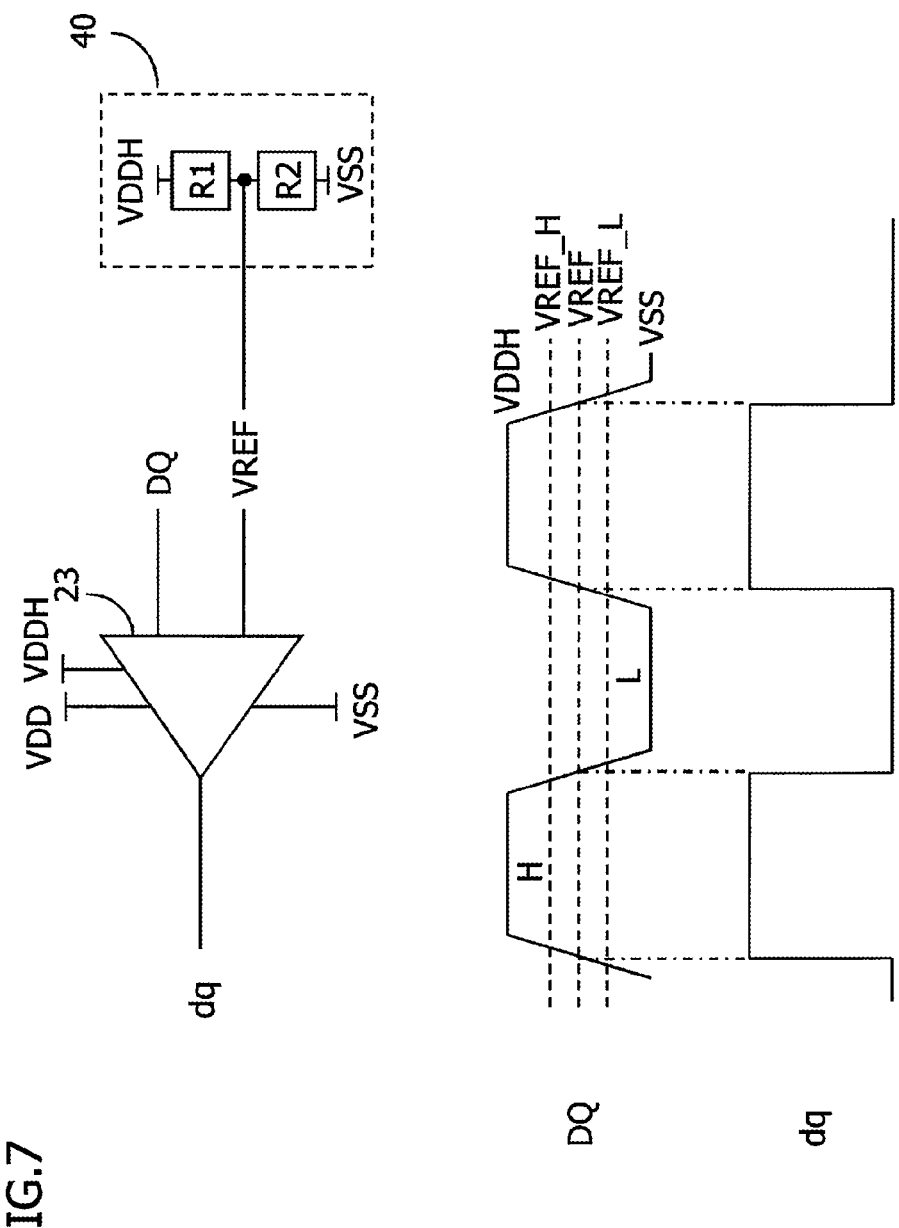
FIG. 7 illustrates changes in the reference voltage VREF in the DQ input buffer.

FIG. 7 illustrates changes in the reference voltage VREF in the DQ input buffer. The DQ input buffer 23 compares the DQ signal transmitted from the main memory 30 with the internally generated reference voltage VREF and outputs a H-level or L-level internal DQ signal dq. As indicated in the figure, the input DQ signal DQ has the amplitude of a power supply VDDH, whereas the reference voltage VREF is set to an electric potential which is 50% the amplitude voltage. The determination margin of the H level and L level of the input DQ signal DQ is maximized on the basis of such a reference voltage VREF.

Meanwhile, the reference voltage VREF is generated by dividing the I/O power supply VDDH with resistors R1 and R2. As a result, as the I/O power supply VDDH changes, the reference voltage VREF also changes. Therefore, as indicated hereinabove, changes in the I/O power supply VDDH cause changes in the duty ratio of the internal DQS signal dqs and also changes in the reference voltage VREF. This is the causal relationship between the changes in the duty ratio of the internal DQS signal dqs and the changes in the reference voltage VREF.

Figure 8:
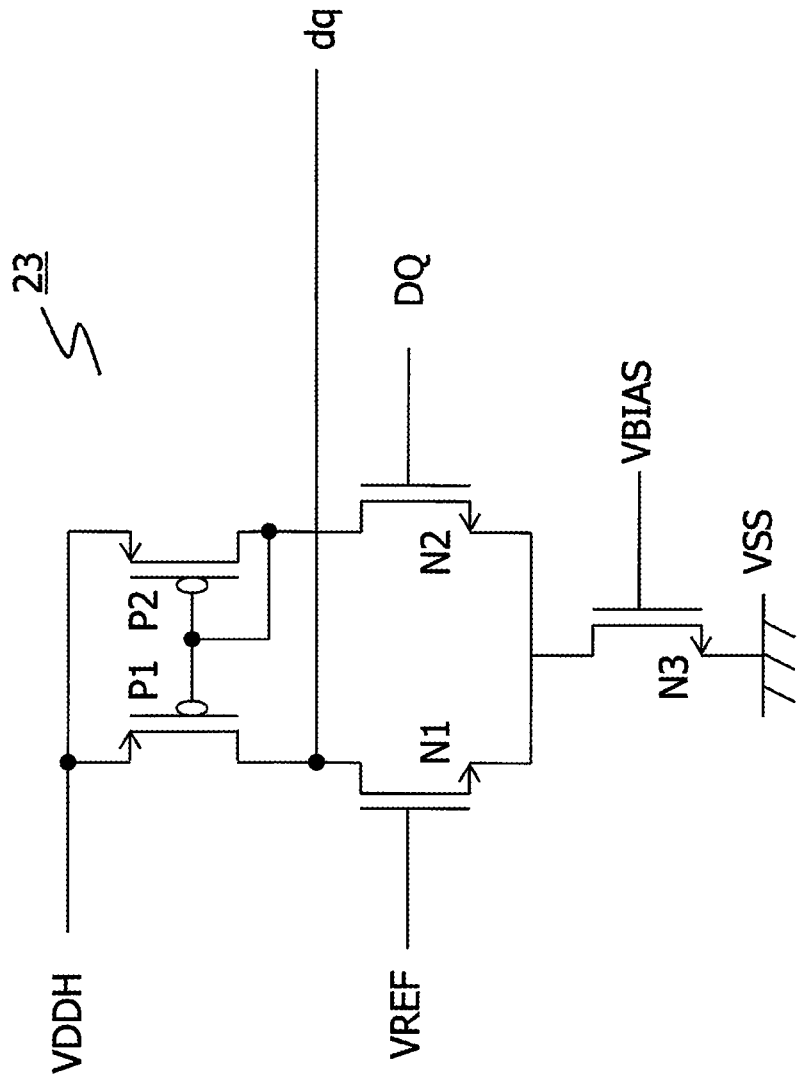
FIG. 8 illustrates an example of the circuitry of the DQ input buffer 23.

FIG. 8 illustrates an example of the circuitry of the DQ input buffer 23. The DQ input buffer 23 has a pair of PMOS transistors P1 and P2 the sources of which are connected to the power supply VDDH, and a pair of NMOS transistors N1 and N2 the sources of which are connected to the ground power supply VSS through a NMOS transistor N3. The reference voltage VREF and the inputted DQ signal DQ are respectively inputted to the gates of the NMOS transistors N1 and N2 constituting a differential pair. A bias VBIAS is inputted to the gate of the NMOS transistor N3, the H level and L level of the inputted DQ signal DQ are detected by comparison with the reference voltage VREF, and the internal DQ signal dq is outputted.

Returning to FIG. 7 when the reference voltage VREF is an electric potential constituting 50% of the amplitude voltage VDDH of the input DQ signal, the determination margin of the H level and L level of the DQ input buffer 23 is maximized and the determination accuracy is maximized. Meanwhile, where the reference voltage decreases to VREF-L, the L level determination margin of the DQ input buffer 23 decreases and the possibility of erroneous determination increases. Conversely, where the reference voltage increases to VREF-H, the H level determination margin of the DQ input buffer 23 decreases and the possibility of erroneous determination increases.

[Duty Ratio Determination and Reference Voltage Adjustment in the Embodiment]

In the memory controller of the present embodiment, in order to inhibit the abovementioned erroneous determination caused by the DQ input buffer, the duty ratio of the DQS signal dqs is measured and the electric potential of the reference voltage VREF of the DQ input buffer is adjusted according to the detected changes in the duty ratio. Accordingly, explained hereinbelow are the duty ratio detection circuit of the present embodiment and the reference voltage generating circuit that adjusts and generates the reference voltage on the basis of the detected duty ratio.

Figure 9:
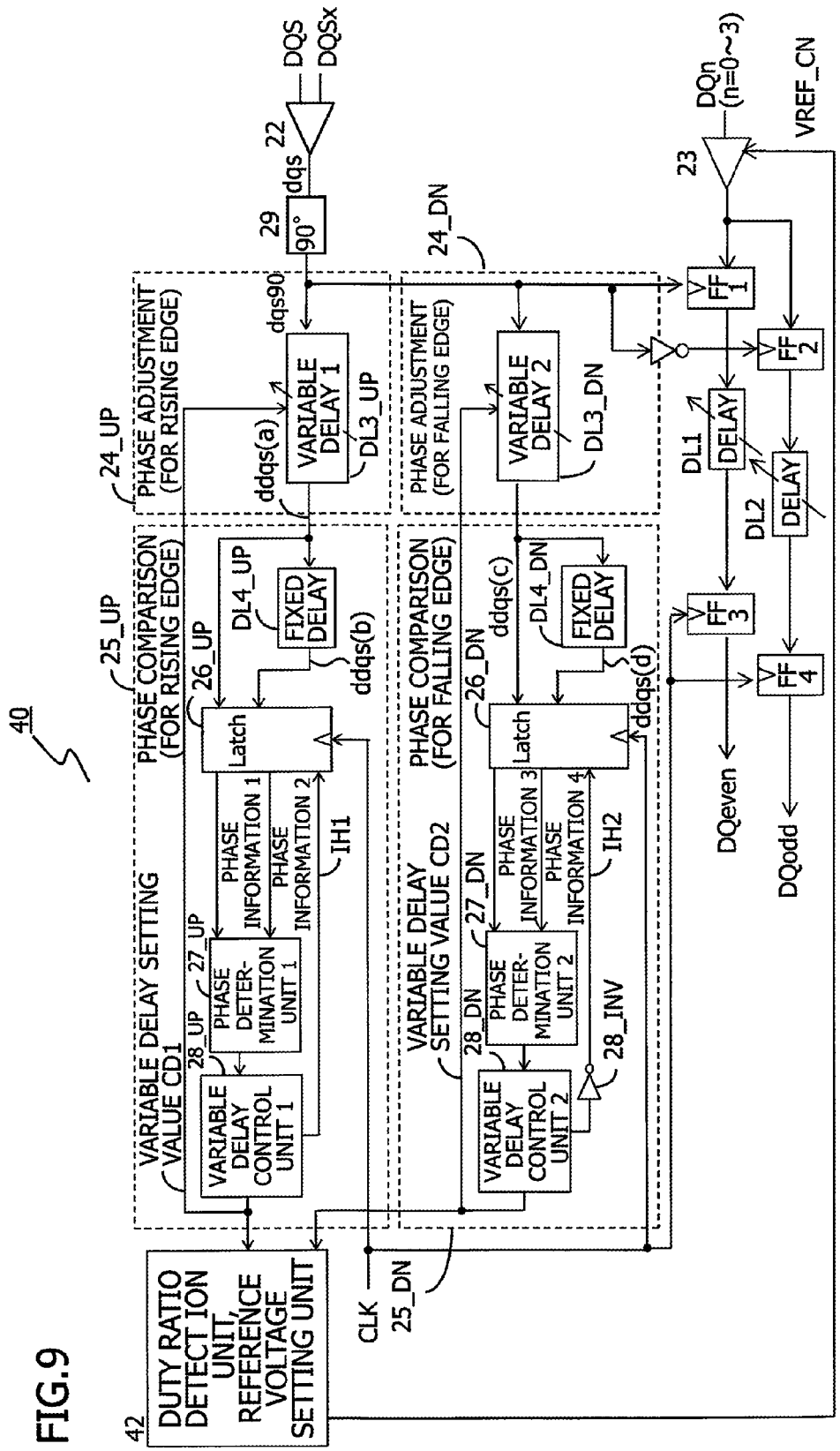
FIG. 9 illustrates the duty ratio detection circuit of the present embodiment.

FIG. 9 illustrates the duty ratio detection circuit of the present embodiment. The duty ratio detection circuit 40 includes rising edge phase difference detection units 24_UP and 25_UP that detect a first phase difference CD1 between the rising edge of the internal DQS signal dqs90 and the first reference edge of the internal clock I_CLK, falling edge phase difference detection units 24_DN and 25_DN that detect a second phase difference CD2 between the falling edge of the internal DQS signal dqs90 and the second reference edge of the internal clock I_CLK, and a duty ratio detection unit 42 that detects the duty ratio from the first phase difference CD1 and the second phase difference CD2. The duty ratio detection unit 42 outputs a reference voltage control signal VREF_CN that controls the reference voltage generating circuit in the DQ input buffer 23 on the basis of the detected duty ratio.

The rising edge phase difference detection units 24_UP and 25_UP are configured in the same manner as explained with reference to FIG. 2 and include a phase difference tuning unit 24_UP for a rising edge and a phase comparator 25_UP for a rising edge. As indicated in FIG. 2, the variable delay setting value of the variable delay circuits DL1 and DL2 that delay the DQ signal is generated by the dedicated phase tuning unit 24 and phase comparator 25.

The phase difference tuning unit 24_UP for a rising edge has a variable delay circuit DL3_UP that delays the internal DQS signal dqs90.

Further, the phase comparator 25_UP for a rising edge has a fixed delay circuit DL4_UP that delays by a fixed value the first delay DQS signal ddqs(a), which is delayed and outputted by the variable delay circuit DL3_UP, and outputs the second delay DQS signal ddqs(b), and a latch circuit 26_UP that is in a latch enable state within the determination timing of the rising edge timing signal IH1 of the ddqs signal and latches the first and second delay DQS signals ddqs(a) and ddqs(b) synchronously with the first falling edges of the internal clock I_CLK.

Further, the phase comparator 25_UP has a phase determination unit 27_UP that determines a phase difference between the rising edge of the delay DQS signal ddqs and the first falling edge of the internal clock I_CLK on the basis of the phase information 1, 2 latched by the latch circuit 26_UP.

The phase comparator 25_UP also has a variable delay control unit 28_UP that generates the variable delay setting value CD1 which controls the delay amount of the variable delay circuit DL3_UP so as to eliminate the phase difference on the basis of the phase determination result of the phase determination unit 27_UP, and also generates the optimum rising edge timing signal IH on the basis of the detected phase difference.

The phase comparison and phase tuning operations of the rising edge phase difference detection units 24_UP and 25_UP are the same as illustrated by FIG. 2. Therefore, the delay amount of the variable delay circuit DL3_UP determined by the variable delay setting value CD1 becomes the phase difference between the rising edge of the DQS signal dqs90 and the reference falling edge of the internal clock I_CLK.

Meanwhile, similarly to the above-described rising edge phase difference detection units 24_UP and 25_UP, the falling edge phase difference detection units 24_DN and 25_DN have a phase tuning unit 24_DN for a falling edge and a phase comparator 25_DN for a falling edge. The configurations thereof are the same as those of the phase tuning unit 24_UP for a rising edge and the phase comparator 25_UP for a rising edge.

However, the difference therebetween is that the falling edge phase difference detection units 24_DN and 25_DN compare the phase difference between the falling edge of the internal DQS signal dqs90 and the second falling edge of the internal clock I_CLK, and therefore the latch circuit 26_DN is in the latch enable state within the determination timing period of the falling edge timing signal IH2 of the ddqs signal and latches third and fourth delay DQS signals ddqs(c) and ddqs(d) synchronously with the second falling edge of the internal clock I_CLK.

Another difference is that, by contrast with the case illustrated by FIG. 5, the phase determination unit 27_DN determines that the phase of the internal DQS signals ddqs(c) and ddqs(d) is advanced with respect to the second falling edge of the internal clock I_CLK when the phase information 4, 3 is [00], matches in the case of "10", and is delayed in the case of "11".

Therefore, the delay amount of the variable delay circuit DL3_DN determined by the variable delay setting value CD2 becomes the phase difference between the falling edge of the DQS signal dqs90 and the reference falling edge of the internal clock I_CLK.

FIGS. 10A, 10B and 10C illustrate the operation of the duty ratio detection circuit 42. FIG. 10A is a timing chart relating to a state in which the phases match when the duty ratio is 50%, FIG. 10B is a timing chart relating to a state in which the phases match when the duty ratio is not 50% (namely, 60%), and FIG. 10C illustrates the shift amount from the duty ratio of 50%.

As indicated in FIG. 10A, the latch circuit 26_UP in the comparator 25_UP for a rising edge latches the delay DQS signals ddqs(a) and ddqs(b) synchronously with the first falling edge DE1 of the internal clock I_CLK while the rising edge timing signal IH1 of the ddqs signal is at the L level, and the phase information 2, 1, which is the latch output, becomes "01" (phases match). At this time, the rising edge of the delay DQS signal ddqs(a) and the reference falling edge DE1 of the internal clock I_CLK are synchronized in phase. Therefore, the delay amount of the variable delay circuit DL3_UP is equal to the phase difference (DL3_UP) between the rising edge of the DQS signal dqs90 and the reference falling edge DE1 of the internal clock I_CLK.

Meanwhile, the latch circuit 26_DN in the comparator 25_DN for a falling edge latches the delay DQS signals ddqs(c) and ddqs(d) synchronously with the second falling edge DE2 of the internal clock I_CLK while the falling edge timing signal IH2 of the ddqs signal is at the L level, and the phase information 4, 3, which is the latch output, becomes "10" (phases match). At this time, the falling edge of the delay DQS signal ddqs(c) and the reference falling edge DE2 of the internal clock I_CLK are synchronized in phase. Therefore, the delay amount of the variable delay circuit DL3_DN is equal to the phase difference (DL3_DN) between the falling edge of the DQS signal dqs90 and the reference falling edge DE2 of the internal clock I_CLK.

Further, the abovementioned two phase differences DL3_UP and DL3_DN are equal to each other. Thus, similarly to FIG. 5, FIG. 10A illustrates an example in which the frequency of the internal clock I_CLK is twice as high as that of the DQS signal, and therefore the phase difference between the first falling edge DE1 and the second falling edge DE2 of the internal clock I_CLK is equal to the phase difference between the rising edge and falling edge of the DQS signal when the duty ratio is 50%. Accordingly, as indicated in FIG. 10C, when the duty ratio is 50%, and two delay amounts DL3_UP and DL3_DN are equal to each other and the difference therebetween is zero.

Further, in the case illustrated by FIG. 10B, the latch circuit 26_UP in the comparator 25_UP for a rising edge likewise latches the delay DQS signals ddqs(a) and ddqs(b) synchronously with the first falling edge DE1 of the internal clock I_CLK while the rising edge timing signal IH1 of the ddqs signal is at the L level, and the phase information 2, 1, which is the latch output, becomes "01" (phases match). At this time, the rising edge of the delay DQS signal ddqs(a) and the reference falling edge DE1 of the internal clock I_CLK are synchronized in phase. Therefore, the delay amount of the variable delay circuit DL3_UP is equal to the phase difference (DL3_UP) between the rising edge of the DQS signal dqs90 and the reference falling edge DE1 of the internal clock I_CLK.

Meanwhile, the latch circuit 26_DN in the comparator 25_DN for a falling edge latches the delay DQS signals ddqs(c) and ddqs(d) synchronously with the second falling edge DE2 of the internal clock I_CLK while the falling edge timing signal IH2 of the ddqs signal is at the L level, and the phase information 4, 3, which is the latch output, becomes "10" (phases match). At this time, the falling edge of the delay DQS signal ddqs(c) and the reference falling edge DE2 of the internal clock I_CLK are synchronized in phase. Therefore, the delay amount of the variable delay circuit DL3_DN is equal to the phase difference (DL3_DN) between the falling edge of the DQS signal dqs90 and the reference falling edge DE2 of the internal clock I_CLK.

Further, the abovementioned two phase differences DL3_UP and DL3_DN are not equal to each other, and the relationship of DL3_UP>DL3_DN is valid. Therefore, as indicated in FIG. 10C, when the duty ratio exceeds 50%, the difference between the two delay amounts becomes DL3_UP−DL3_DN>0. Conversely, where the duty ratio is less than 50%, the difference between the two delay amounts becomes DL3_UP−DL3_DN<0.

Thus, on the basis of the difference between the first phase difference between the rising edge of the DQS signal and the first reference edge DE1 of the internal clock I_CLK and the second phase difference between the falling edge of the DQS signal and the second reference edge DE2 of the internal clock I_CLK, it is possible to detect the degree of deviation of the duty ratio of the DQS signal from 50%. This conclusion presumes that the reference edge of the internal clock I_CLK has a constant period.

Figure 12:
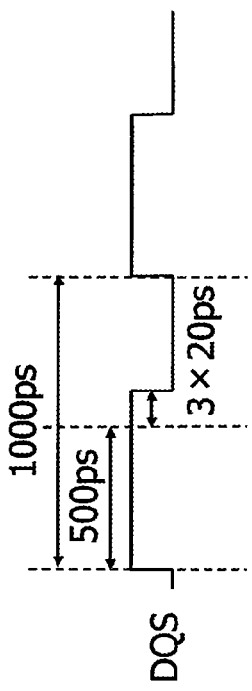
FIG. 12 illustrates the operation of the duty ratio detection unit 42.

FIG. 12 illustrates the operation of the duty ratio detection unit 42. The duty ratio is defined as follows.

$$\text{Duty} = \{(H \text{ width of DQS signal})/(\text{Period of DQS signal})\} * 100\%.$$

Where the difference between the variable delay setting value CD1 and the variable delay setting value CD2 is defined as X, the duty ratio is as follows:

$$\text{Duty} = 50 + aX \qquad (1),$$

where the coefficient (a) is defined as:

$$a = \{(\text{Unit delay amount of variable delay circuits DL3\_UP and DL3\_DN})/(\text{Period of DQS signal})\} * 100.$$

Here, it is assumed that the variable delay circuits DL3_UP and DL3_DN are obtained by connecting in series a plurality of unit delay elements and that the number of the unit delay elements is set variably according to the variable delay setting values CD1 and CD2. The delay time of the unit delay element corresponds to the abovementioned unit delay amount. In other words, the abovementioned Equation (1) indicates that the duty ratio can be calculated by multiplying the difference X between the variable delay setting values CD1 and CD2 by the coefficient (a) relating to the period of the DQS signal of the unit delay amount and then adding the product obtained to 50%.

FIG. 12 illustrates an example in which X=3, the period of the DQS signal is 1000 ps, and the unit delay amount of the variable delay circuit is 20 ps. In this case, the coefficient (a) is a=20/1000×100=2. The duty ratio "duty" is calculated in the following manner with Equation (1):

$$duty=50+aX=50+2\times3=56\%.$$

FIG. 12 also depicts a diagram representing the relationship between the duty ratio and the difference X between the variable delay setting values CD1 and CD2. According to this diagram, when X>0, the H width of the DQS signal is large and the duty ratio exceeds 50%, when X=0, the H width and L width of the DQS signal are equal to each other and the duty ratio is 50%, and when X<0, the L width of the DQS signal is large and the duty ratio is less than 50%.

Figure 11:
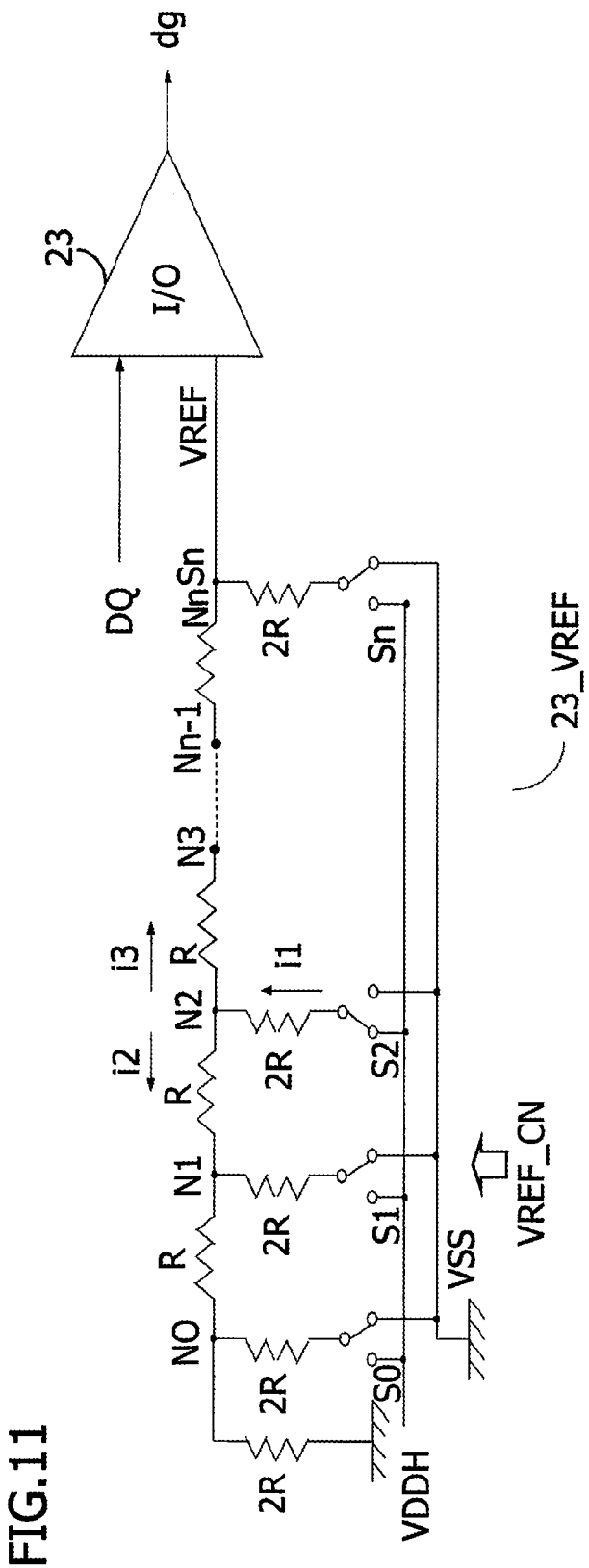
FIG. 11 illustrates an example of the reference voltage generating circuit in the DQ input buffer.

FIG. 11 illustrates an example of the reference voltage generating circuit in the DQ input buffer. The DQ input buffer 23 has a reference voltage generating circuit 23_VREF that generates a reference voltage VREF. The reference voltage VREF generating circuit 23_VREF adjusts the electric potential of the reference voltage on the basis of the reference voltage control signal VREF_CN supplied from the duty ratio detection unit 42.

The reference voltage generating circuit 23_VREF shown by way of example in FIG. 11 is a ladder circuit of resistors 2R and resistors R. The resistors 2R connected to the nodes N0 to Nn are connected to the I/O power supply VDDH or a ground voltage VSS through the switches S0 to Sn. As for a reference voltage control signal VREF-CN, one of the switches S0 to Sn is connected to the I/O power supply VDDH, and all other switches are connected to the ground power supply VSS.

In such a circuit, only the resistor 2R of the node N2 is connected through the switch S2 to the I/O power supply VDDH. The resistance value on the left side from the node N0 is 2R, the resistance value on the left side from the node N1 is also 2R, and the resistance value on the left side from the node N2 is also 2R. Meanwhile, the resistance value on the right side from the node Nn is 2R. Likewise, the resistance value on the right side from the node Nn-1 is also 2R. In the same manner, the resistance values on the right side from the nodes Nn-2 to N2 are all 2R.

Therefore, due to the reference voltage control signal VREF-CN, the voltage on the left and right side from the node N2 connected to the I/O power supply VDDH becomes 2R. As a consequence, since two resistors 2R connected in parallel are provided between the node N2 and the ground VSS, and one resistor 2R is provided between the node N2 and the I/O power supply VDDH, the voltage at the node N2 becomes VDDH/3 as a result of dividing the I/O power supply VDDH by the resistances of 2R and R.

Further, electric currents i2 and i3 flowing on the left and right sides from the node N2 are equal to each other, that is, i2=i3, and the electric current i1 flowing from the I/O power supply VDDH to the node N2 is i1=i2+i3 because the resistance values on the left and right sides from the node N2 to the ground VSS is equal to 2R. Furthermore, the electric current is also branched in half in the node N3 which is adjacent on the right side.

Therefore, since weighting coefficients 1/2, 1/4, 1/($2^L$) are applied to the resistor 2R of the switch Sk (k=0 to n), the reference voltage VREF on the node Sn becomes as follows:

$$VREF=(1/2^{n-k})*(VDDH/3) \quad (2).$$

Thus, the reference voltage VREF generated on the node Sn is variably controlled as indicated by Equation (2) hereinabove as a result of connecting a certain node Sk to the I/O power supply VDDH side by the reference voltage control signal VREF_CN.

Figure 13:
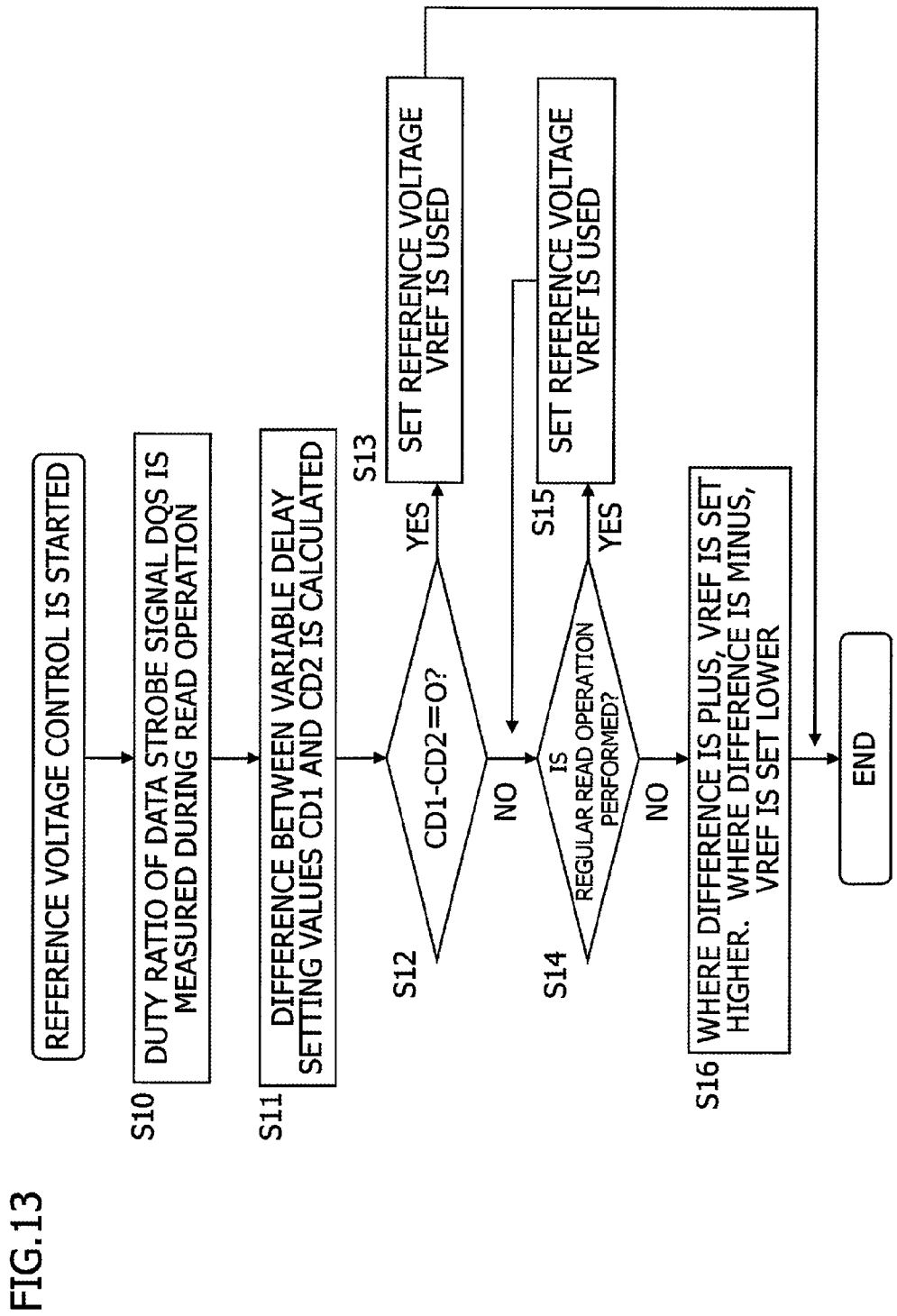
FIG. 13 is a flowchart of the reference voltage control process performed by the memory controller according to the present embodiment.

FIG. 13 is a flowchart of the reference voltage control process performed by the memory controller according to the present embodiment. The memory controller measures the duty ratio of the received data strobe signal DQS which performing the read operation control (S10). The duty ratio measurement circuit 40 controls the variable delay setting values CD1 and CD2 of the variable delay circuits DL3_UP and DL3_DN such as to zero the phase difference between the first and second reference edges of the internal clock I_CLK, which serves as a reference, and the rising edge and falling edge of the DQS signal. Then, the duty ratio measurement circuit 40 detects whether or not the difference between the variable delay setting values CD1 and CD2 is zero (S12). When the difference is zero (YES in S12), the duty ratio of the DQS signal is 50%, and therefore, the usage of the set reference voltage VREF is continued (S13). Meanwhile, when the difference is not zero (NO in S12), it means that the duty ratio of the DQS signal has shifted from 50%. Accordingly, where a regular read operation is performed (YES in S14), the usage of the set reference voltage VREF is continued, but when the regular read operation is not performed (NO in S14), the reference voltage VREF is set higher or lower according to the difference between the variable delay setting values CD1 and CD2 (S16).

FIG. 14 illustrates the reference voltage control process of the present embodiment. When the H level width and L level width of the DQS signal measured by the duty ratio measurement circuit 40 are equal to each other and the difference therebetween is zero, that is, when the difference between the variable delay setting values CD1 and CD2 is zero (CD1–CD2=0), the reference voltage VREF relating to the DQ signal is set to an adequate electric potential.

Meanwhile, where the H level width of the DQS signal is larger than the L level width and the difference is positive, that is, when the difference between the variable delay setting values CD1 and CD2 is positive (CD1–CD2>0), the reference voltage VREF relating to the DQ signal decreases below the adequate electric potential. Therefore, the tuning is performed by changing the reference voltage control signal VREF_CN so as to raise the reference voltage VREF. As a result, the reference voltage VREF is adjusted to come close to the central value of the amplitude voltage of the received data signal DQ.

Further, where the H level width of the DQS signal is less than the L level width and the difference is negative, that is, when the difference between the variable delay setting values CD1 and CD2 is negative (CD1–CD2<0), the reference voltage VREF relating to the DQ signal rises above the adequate electric potential. Therefore, the tuning is performed by changing the reference voltage control signal VREF_CN so as to lower the reference voltage VREF. As a result, the reference voltage VREF is adjusted to come close to the central value of the amplitude voltage of the received data signal DQ.

In the phase tuning control illustrated by FIG. 2, the memory controller implements a pseudo-read operation in a training period and tunes the phase of the received DQ signal before the regular read operation or write operation is started. Accordingly, the reference voltage control process of the present embodiment may be implemented in the above-mentioned training period.

As mentioned hereinabove, according to the present embodiment, the duty ratio of the DQS signal is measured using the correlation between the duty ratio of the DQS signal and the reference voltage VREF, the reference voltage VREF is variably controlled according to the detected duty ratio, and the reference voltage VREF is adjusted to bring it close to the central value of the amplitude voltage of the DS signal. Therefore, the determination margin of the H level and L level of the DQ signal is maximized and the erroneous determination is inhibited.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

The invention claimed is:

1. A memory controller comprising:
a first input buffer that determines a data signal that is to be received, based on a reference voltage;
a second inputs buffer that inputs a data strobe signal that is to be received;
a data latch circuit that fetches an internal data signal, which is outputted by the first input buffer, based on a phase of a rising edge and a falling edge of an internal data strobe signal, which is outputted by the second input buffer;
a duty ratio detection circuit that detects a duty ratio of the internal data strobe signal, the duty ratio detection circuit including
a first phase difference detection unit that detects a first phase difference between a rising edge of the internal data strobe signal and a first reference edge of a clock,
a second phase difference detection unit that detects a second phase difference between a falling edge of the internal data strobe signal and a second reference edge of the clock and
a duty ratio detection unit that detects the duty ratio from the first phase difference and the second phase difference; and
a reference voltage generating circuit that adjusts the reference voltage based on the duty ratio detected by the duty ratio detection circuit,
the first phase difference detection unit includes: a first variable delay circuit that delays the internal data strobe signal by a delay amount based on a first variable delay setting value; and a first phase comparator that detects the first phase difference between a rising edge of a first delay data strobe signal delayed and output by the first variable delay circuit and the first reference edge of the clock and generates the first variable delay setting value according to the first phase difference,
the second phase difference detection unit includes: a second variable delay circuit that delays the internal data strobe signal by a delay amount based on a second variable delay setting value; and a second phase comparator that detects the second phase difference between a falling edge of a second delay data strobe signal delayed and output by the second variable delay circuit and the second reference edge of the clock and generates the second variable delay setting value according to the second phase difference; and
the duty ratio detection unit calculates the duty ratio based on a difference between the first variable delay setting value and the second variable delay setting value.

2. The memory controller according to claim 1, wherein the first phase comparator uses as the first reference edge of the clock an edge of the clock within a phase determination timing period of a first phase determination timing signal generated from the clock; and
the second phase comparator uses as the second reference edge of the clock an edge of the clock within a phase determination timing period of a second phase determination timing signal obtained by inverting the first phase determination timing signal.

3. The memory controller according to claim 1, wherein the first phase comparator generates the first variable delay setting value so as to reduce the first phase difference, and
the second phase comparator generates the second variable delay setting value so as to reduce the second phase difference.

4. The memory controller according to claim 1, wherein the reference voltage generating circuit increases the reference voltage when the duty ratio is higher than 50%, and decreases the reference voltage when the duty ratio is lower than 50%.

5. An information processing device comprising:
an arithmetic processing unit that output a request of a memory access;
a memory that outputs a data signal and a data strobe signal synchronized with the data signal in response to the memory access; and
a memory controller that performs control of access to the memory in response to the request of the memory access, wherein
the memory controller includes:
a first input buffer that determines the data signal that is to be received from the memory, based on a reference voltage;
a second input buffer that inputs the data strobe signal that is to be received from the memory;
a data latch circuit that fetches an internal data signal, which is outputted by the first input buffer, based on a phase of a rising edge and a falling edge of an internal data strobe signal, which is outputted by the second input buffer;
a duty ratio detection circuit that detects a duty ratio of the internal data strobe signal, the duty ratio detection circuit including
a first phase difference detection unit that detects a first phase difference between a rising edge of the internal data strobe signal and a first reference edge of a clock,
a second phase difference detection unit that detects a second phase difference between a falling edge of the internal data strobe signal and a second reference edge of the clock and
a duty ratio detection unit that detects the duty ratio from the first phase difference and the second phase difference; and
a reference voltage generating circuit that adjusts the reference voltage based on the duty ratio detected by the duty ratio detection circuit,
the first phase difference detection unit includes: a first variable delay circuit that delays the internal data strobe signal by a delay amount based on a first variable delay setting value; and a first phase comparator that detects the first phase difference between a rising edge of a first delay data strobe signal delayed and output by the first variable delay circuit and the first reference edge of the clock and generates the first variable delay setting value according to the first phase difference, the second phase difference detection unit includes: a second variable delay circuit that delays the internal data strobe signal by a delay amount based on a second variable delay setting value; and a second phase comparator that detects the second phase difference between a falling edge of a second delay data strobe signal delayed and output by the second variable delay circuit and the second reference edge of the clock and generates the second variable delay setting value according to the second phase difference; and the duty ratio detection unit calculates the duty ratio based on a difference between the first variable delay setting value and the second variable delay setting value.

6. A reference voltage adjustment method in a memory controller including:

a first input buffer that determines a data signal that is to be received, based on a reference voltage;

a second input buffer that inputs a data strobe signal that is to be received;

a data latch circuit that fetches an internal data signal, which is outputted by the first input buffer, based on a phase of a rising edge and a falling edge of an internal data strobe signal outputted by the second input buffer, the method comprising:

detecting a duty ratio of the internal data strobe signal, the detecting the duty ratio including detecting a first phase difference between a rising edge of the internal data strobe signal and a first reference edge of a clock, detecting a second phase difference between a falling edge of the internal data strobe signal and a second reference edge of the clock and detecting the duty ratio from the first phase difference and the second phase difference; and adjusting the reference voltage based on the detected duty ratio, the detecting the first phase difference includes: a first variably delaying the internal data strobe signal by a delay amount based on a first variable delay setting value; and a first phase comparing that includes detecting the first phase difference between a rising edge of a first delay data strobe signal delayed by the first variably delaying and the first reference edge of the clock to generate the first variable delay setting value according to the first phase difference, the detecting the second phase difference includes: a second variably delaying the internal data strobe signal by a delay amount based on a second variable delay setting value; and a second phase comparing that includes detecting the second phase difference between a falling edge of a second delay data strobe signal delayed by the second variably delaying and the second reference edge of the clock to generate the second variable delay setting value according to the second phase difference; and the detecting the duty ratio includes calculating the duty ratio based on a difference between the first variable delay setting value and the second variable delay setting value.

* * * * *